United States Patent [19]

Matsuo et al.

[11] Patent Number: 5,063,433
[45] Date of Patent: Nov. 5, 1991

[54] SEMICONDUCTOR DEVICE HAVING MULTI-LAYERED WIRING STRUCTURE

[75] Inventors: Kenji Matsuo, Yokohama; Tadashi Nonaka, Kawasaki; Ikuo Tsuchiya, Yokohama, all of Japan

[73] Assignee: Kabushiki Kaisha Toshiba, Kawasaki, Japan

[21] Appl. No.: 508,692

[22] Filed: Apr. 13, 1990

[30] Foreign Application Priority Data

Apr. 26, 1989 [JP] Japan .................................. 1-104608

[51] Int. Cl.⁵ .................... A01L 23/48; H01L 23/52
[52] U.S. Cl. ...................................... 357/71; 357/68; 357/75
[58] Field of Search ................. 387/75, 71, 68, 49, 387/69, 54, 45, 80

[56] References Cited

U.S. PATENT DOCUMENTS

| | | | |
|---|---|---|---|
| 4,626,889 | 12/1986 | Yamamoto et al. | 357/71 |
| 4,628,343 | 12/1986 | Komatsu | 357/68 |
| 4,684,973 | 8/1987 | Takano et al. | 357/68 |
| 4,825,280 | 4/1989 | Cheh et al. | 357/71 |
| 4,833,521 | 5/1989 | Early | 357/71 |
| 4,908,690 | 3/1990 | Hata et al. | 357/68 |
| 4,924,293 | 5/1990 | Saito et al. | 357/71 |
| 4,970,572 | 11/1990 | Kano et al. | 357/71 |

FOREIGN PATENT DOCUMENTS

| | | |
|---|---|---|
| 3309223 | 3/1982 | Fed. Rep. of Germany . |
| 0103362 | 3/1984 | European Pat. Off. . |
| 0163384 | 12/1985 | European Pat. Off. . |
| 61-46050 | 3/1986 | Japan . |

Primary Examiner—Rolf Hille
Assistant Examiner—Sheila V. Clark
Attorney, Agent, or Firm—Finnegan, Henderson, Farabow, Garrett, and Dunner

[57] ABSTRACT

A semiconductor device comprises a first pad region applied with a first potential, a first line led from the first pad region and connected to a first circuit, a second pad region integrated with the first pad region and applied also with the first potential, and a second line led from the second pad region connected to a second circuit and overlapped with the first line.

12 Claims, 8 Drawing Sheets

SEMICONDUCTOR DEVICE HAVING MULTI-LAYERED WIRING STRUCTURE

BACKGROUND OF THE INVENTION

1. Field of the Invention

The present invention relates to a semiconductor device and, more particularly, a semiconductor device having a multi-layered wiring structure.

2. Description of the Related Art

Figure 3:
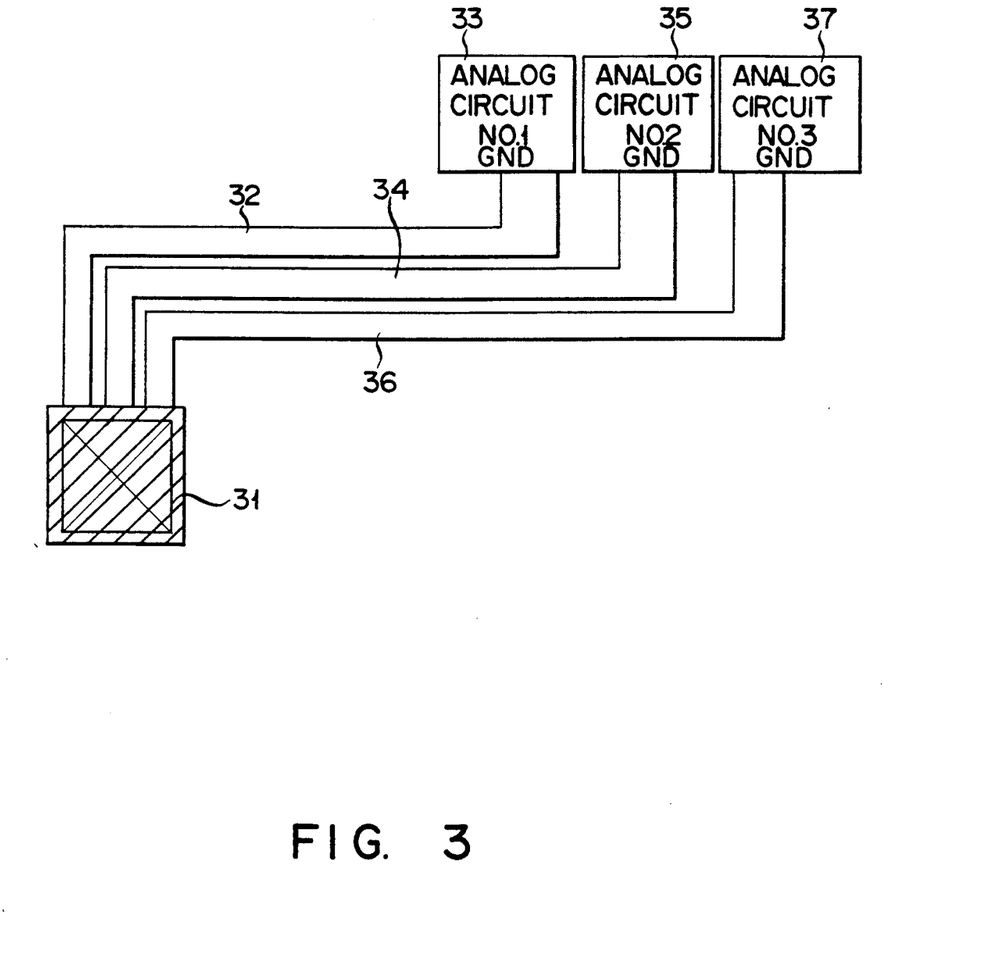
FIG. 3 is a partial plane view of a semiconductor device having no multi-layered wiring structure.

FIG. 3 is a plan view showing a structure around a bonding pad of a semiconductor device to which the present invention is not applied.

This semiconductor device comprises bonding pad 31 applied with a ground potential, first line 32 led from bonding pad 31 and connected to a ground terminal of first analog circuit 33, second line 34 led from bonding pad 31 and connected to a ground terminal of second analog circuit 35, and third line 36 led from bonding pad 31 and connected to a ground terminal of third analog circuit 37.

In such a semiconductor device, since lines 32, 34 and 36 are branched from bonding pad 31 and respectively connected to the analog circuits 33, 35 and 37, an impedance of a common line portion of lines 32, 34 and 36 can be suppressed, thereby reducing interference among circuits No. 1 to No. 3.

In the above semiconductor device, in order to reduce the interference among the circuits so as to suppress the impedance of a common line portion of lines 32, 34 and 36, lines 32, 34 and 36 are branched from bonding pad 31 to analog circuits 33, 35 and 37. In this case, since the area of the semiconductor substrate is limited, when three lines 32, 34 and 36 are used for connecting analog circuits 33, 35 and 37 to bonding pad 31, the width of each line must be decreased. As a result, the impedance (direct-current resistance) of each line is increased.

SUMMARY OF THE INVENTION

It is an object of the present invention to provide a semiconductor device capable of setting the width of each line connected from a bonding pad to separate circuits to be relatively large within the limited area of a semiconductor substrate so as to reduce the impedance of each line.

In order to achieve the above object, according to the present invention, there is provided a semiconductor device comprising a first pad region applied with a first potential; a first line led from the first pad region and connected to a first circuit; a second pad region connected to the first pad region and applied with the first potential; and a second line, led from the second pad region, connected to a second circuit and superposed on or overlapped with the first line.

According to the semiconductor device, multilayered lines are respectively led from the pad region to each circuit. For this reason, the width of each line connected to each circuit can be set to be large independently of the number of lines, thereby reducing the impedance of each line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A semiconductor device according to an embodiment of the present invention will be described below with reference to the accompanying drawings.

Figure 1A:
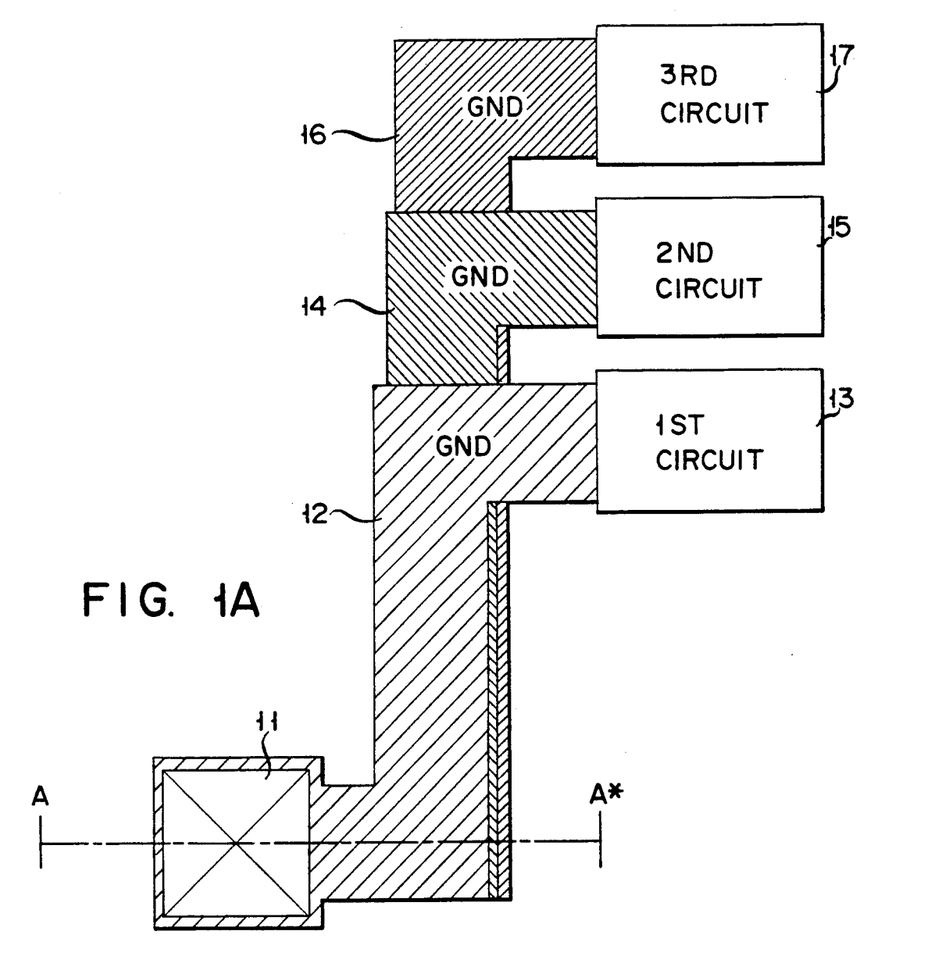
FIG. 1A is a partial plane view of a semiconductor device having a multi-layered wiring structure according to an embodiment of the present invention.
Figure 1B:
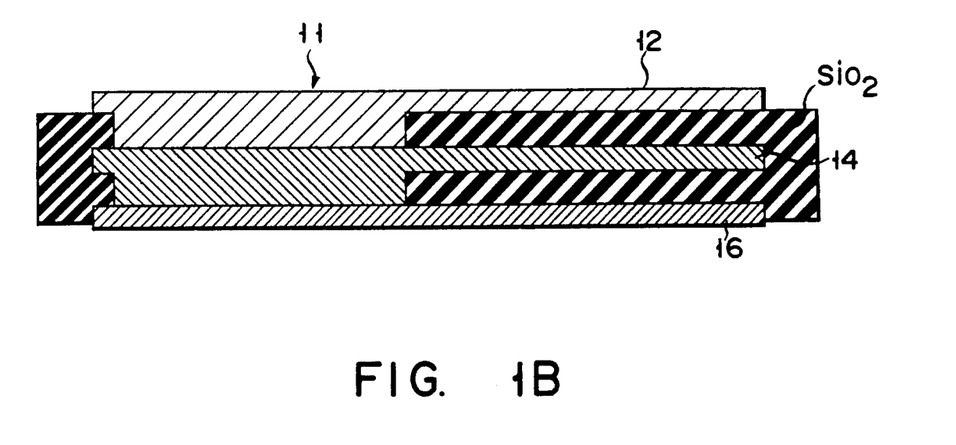
FIG. 1B is a sectional view taken along a line A—A* in FIG. 1A.

FIG. 1A is a plane view showing a structure of a peripheral portion of a bonding pad of a semiconductor device according to the first embodiment of the present invention, and FIG. 1B is a sectional view taken along a line A—A* in FIG. 1A.

This semiconductor device comprises bonding pad 11 applied with a ground potential and constituted by a 3-stacked structure of wiring layers, with upper aluminum line 12 connected to a ground potential of first analog circuit 13, middle aluminum line 14 connected to a ground terminal of second analog circuit 15, and lower aluminum line 16 connected to a ground terminal of third analog circuit 17. Layers 12, 14 and 16 are isolated from each other by insulating interlayers made of, e.g., $SiO_2$. Note that lines 12, 14 and 16 may be made of polysilicon or diffusion layers when a current supplied to these lines is small.

In this semiconductor device, 3-story lines 12, 14 and 16 are respectively led from bonding pad 11 having a 3-stacked structure to analog circuits 13, 15 and 17. In this arrangement, the width of each line 12, 14 and 16 need not to be thin and can be arbitrarily set within the area of the substrate. Therefore, since the only common circuit of the three lines 12, 14 and 16 is pad 11, its impedance can be suppressed. At the same time, the impedance of lines 12, 14 and 16 can be reduced since the width of each line 12, 14 and 16 can be increased.

Note that an analog circuit of the present invention includes a circuit having a digital circuit portion such as a D/A converter. In this embodiment in FIG. 1, all lines 12, 14 and 16 are respectively connected to analog circuits, but some of the lines may be connected to digital circuits. However, since linearly changing values are processed in the analog circuit, the analog circuit tends to be influenced by variations in ground potential and a power source potential caused by a common impedance of these lines. For this reason, the effect (the effect for reducing a mutual interference caused by a common impedance of lines) is more preferable when the multi-layered structure in FIG. 1 is employed in an analog circuit than when that is employed in a digital circuit. In addition, in the present invention, lines 12, 14 and 16 are connected to the ground terminals of circuits. However, even when a multi-layered wiring structure having the same structure as the above lines is connected to a power source terminal, the same effect can be obtained.

Figure 2A:
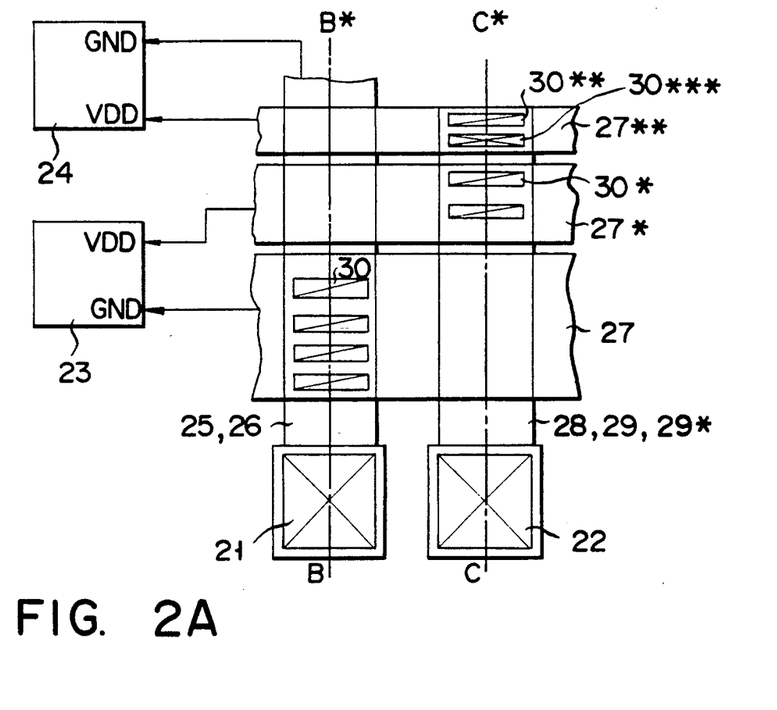
FIG. 2A is a partial plane view of a semiconductor device having a multi-layered wiring structure according to another embodiment of the present invention.
Figure 2B:
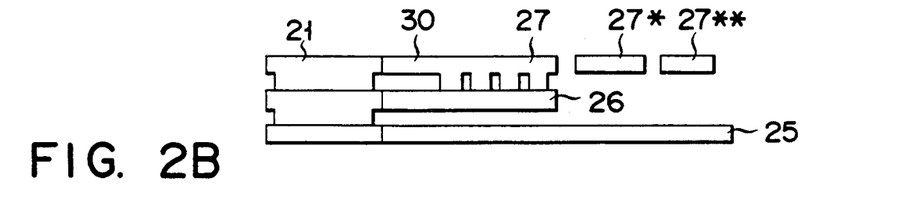
FIG. 2B is a sectional view taken along a line B—B* in FIG. 2A.
Figure 2C:
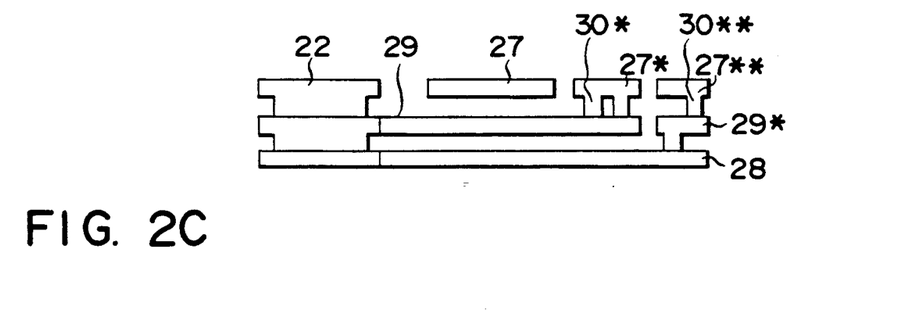
FIG. 2C is a sectional view taken along a line C—C* in FIG. 2A.

FIG. 2A is a plan view showing a structure around a bonding pad of a semiconductor device according to the second embodiment of the present invention, and FIGS. 2B and 2C are sectional views taken along lines B—B* and C—C* in FIG. 2A, respectively.

The semiconductor device comprises bonding pad 21 applied with a ground potential and constituted by a 3-stacked wiring structure, line 25 constituted by a first wiring layer, line 26 constituted by a second wiring layer, line 27 constituted by a third wiring layer, bonding pad 22 applied with a power source potential and constituted by a 3-stacked wiring structure, line 28 constituted by a first wiring layer, lines 29 and 29* constituted by a second wiring layer, and lines 27* and 27** constituted by a third wiring layer. Lines 25, 26, 27, 27*, 27**, 28, 29, and 29* serving as power source lines and ground lines are separately connected into peripheral circuit (such as an output buffer) 23 and internal circuit (such as a logic gate or a memory) 24.

Of lines 25, 26 and 27 serving as ground lines, line 25 of the first layer is connected to a ground terminal of internal circuit 24, and lines 26 and 27 of the second and third layers are connected to each other through contact hole 30 and to a ground terminal of peripheral circuit 23. Of lines 28, 29, 29*, 27*, and 27**, lines 28, 29* and 27 of the first, second, and third layers are connected to each other through contact holes 30 and 30***, and to a power source terminal of internal circuit 24. Lines 29 and 27* of the second and third layers are connected to each other through contact hole 30* and to a power source terminal of peripheral circuit 23.

According to the above semiconductor device, the same impedance reduction effect as in the embodiment of FIG. 1 can be obtained. In addition, a plurality of multi-layered lines can be employed in a portion requiring large-width lines, thereby freely selecting any size of a line.

According to the present embodiment as described above, there is provided to a semiconductor device wherein a multi-layered pad is formed, lines are respectively led from these layers to circuits, and the widths of the lines can be freely increased to reduce impedances of the lines.

Figure 4A:
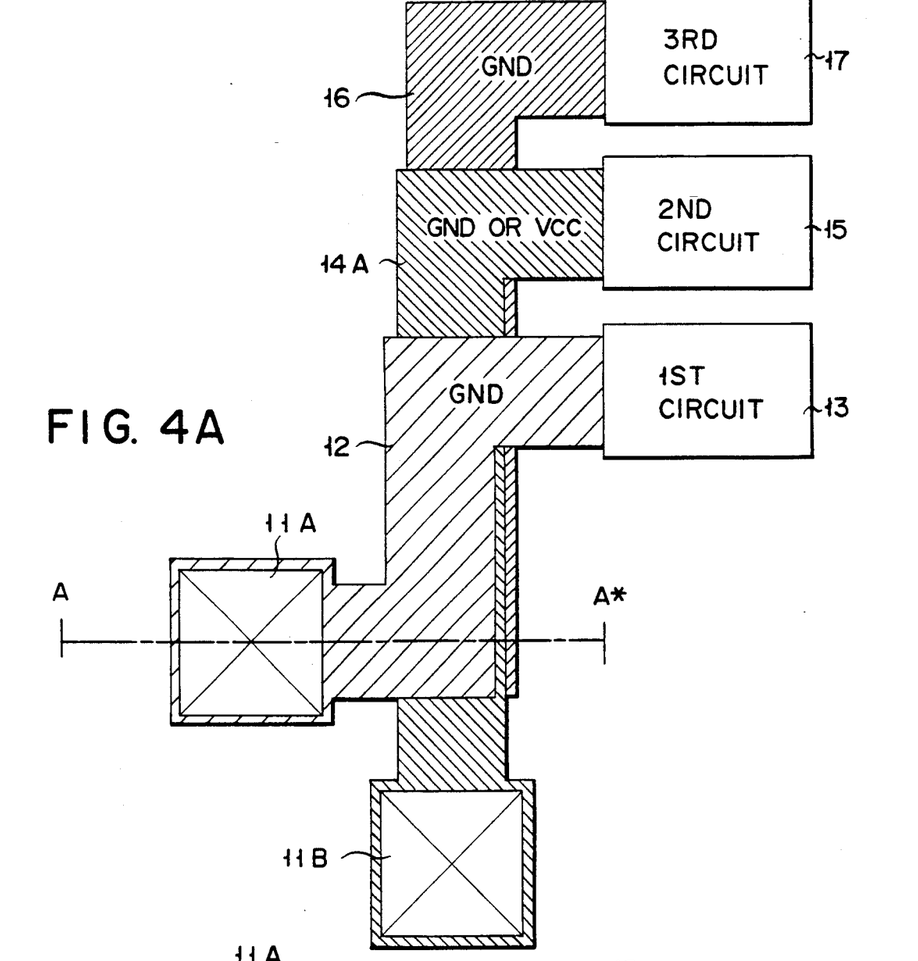
FIG. 4A is a partial plane view of a semiconductor device having a multi-layered wiring structure according to still another embodiment of the present invention.
Figure 4B:
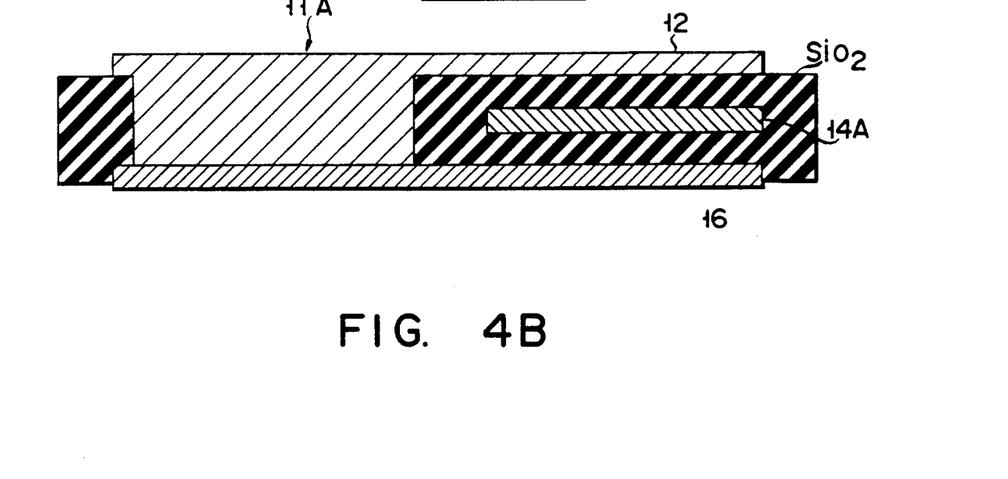
FIG. 4B is a sectional view taken along a line A—A* in FIG. 4A.

FIG. 4A is a partial plane view of a semiconductor device having a multi-layered wiring structure, and FIG. 4B is a sectional view taken along a line A—A* in FIG. 4A.

In the embodiment in FIG. 1A, three GND lines 12, 14 and 16 are electrically connected to one pad 11. In contrast, according to the embodiment of FIG. 4A, two GND lines 12 and 16 are electrically connected to one pad 11A, and line 14A interposed between lines 12 and 16 each having the same potential (GND potential) is electrically connected to another pad 11B.

In FIG. 4A, when line 14A is a ground line of a circuit for amplifying a small analog signal in second circuit 15, lines 12 and 16 each having the GND potential between which line 14A is interposed are used as an electrostatic shield with respect to line 14A. When line 14A is a power supply line of second circuit 15, capacitances between lines 14A and 12 and between lines 14A and 16 are used as bypass capacitors parallelly connected to the power supply line of second circuit 15.

Figure 5:
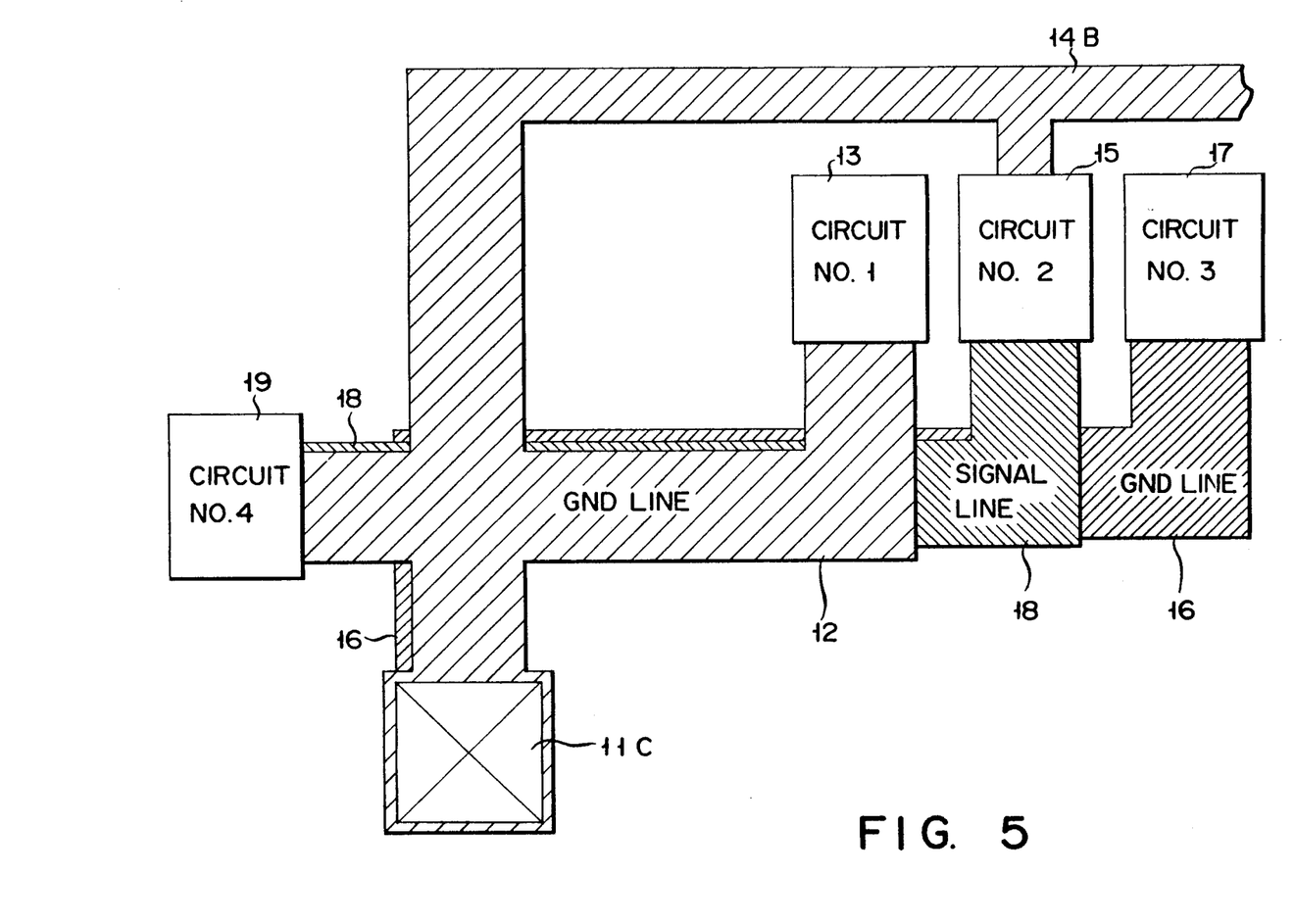
FIG. 5 is a partial plane view showing a wiring pattern of a semiconductor device having a multi-layered wiring structure according to the present invention.

FIG. 5 is a partial plane view showing a line pattern of a semiconductor device having a multi-layered wiring structure according to the present invention. In this embodiment, a signal line (one or more signal lines) 18 for connecting second circuit 15 to fourth circuit 19 is sandwiched between GND lines 12 and 16 of first and third circuits 13 and 17. Lines 12 and 16 are electrically connected to pad 11C and have the same potential (GND potential), and signal line 18 is electrostatically shielded by lines 12 and 16.

Figure 6:
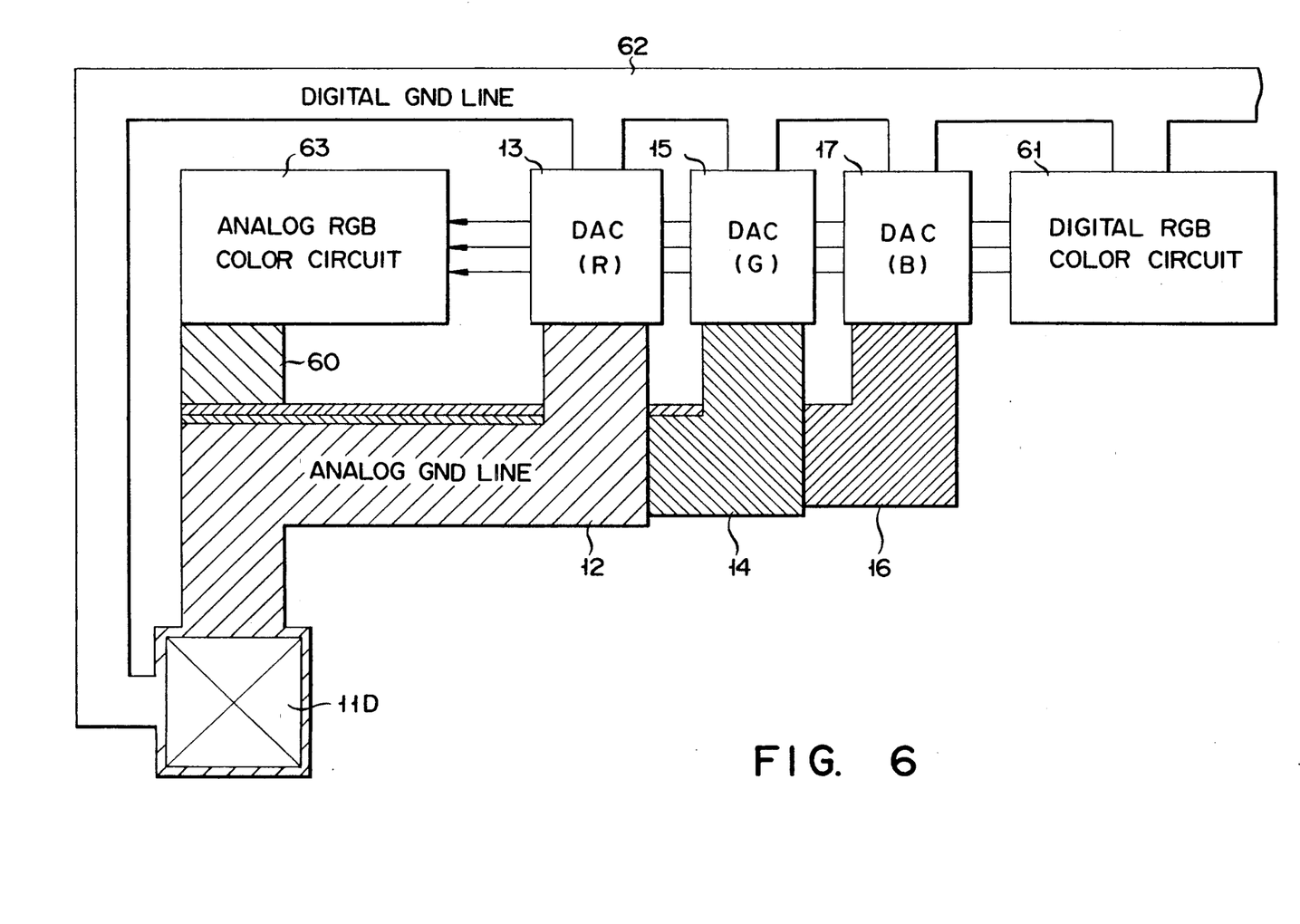
FIG. 6 is a partial plane view showing another wiring pattern of a semiconductor device having a multi-layered wiring structure according to the present invention.

FIG. 6 is a partial plan view showing another line pattern of a semiconductor device having a multi-layered wiring structure according to the present invention.

In this embodiment, in order to prevent signal interference at a small signal level caused by a GND line impedance, GND lines for analog signals of R, G and B D/A converters 13, 15 and 17 are isolated from each other with a multi-layered wiring structure and combined at the position of pad 11D.

Since GND line 62 for a digital signal of D/A converters 13, 15 and 17 transmits only high-level signals independent of the low-level signal, signal interference can be neglected. Therefore, in place of a multi-layered wiring structure, simple single-layered line 62 can be practically used as GND line 62 for a digital signal. A special-purpose pad may be provided to this GND line 62 for a digital signal. However, when the special-purpose pad cannot be provided to GND line 62 because of limitation of the size of the IC pellet, GND line 62 for a digital signal may be connected to pad 11D for an analog signal, as is shown in FIG. 6.

Note that the GND of digital RGB circuit 63 for processing only a digital signal is connected to line 62, and the GND of analog RGB circuit 63 for processing only an analog signal is connected to pad 11D through multi-layered line 60.

Figure 7:
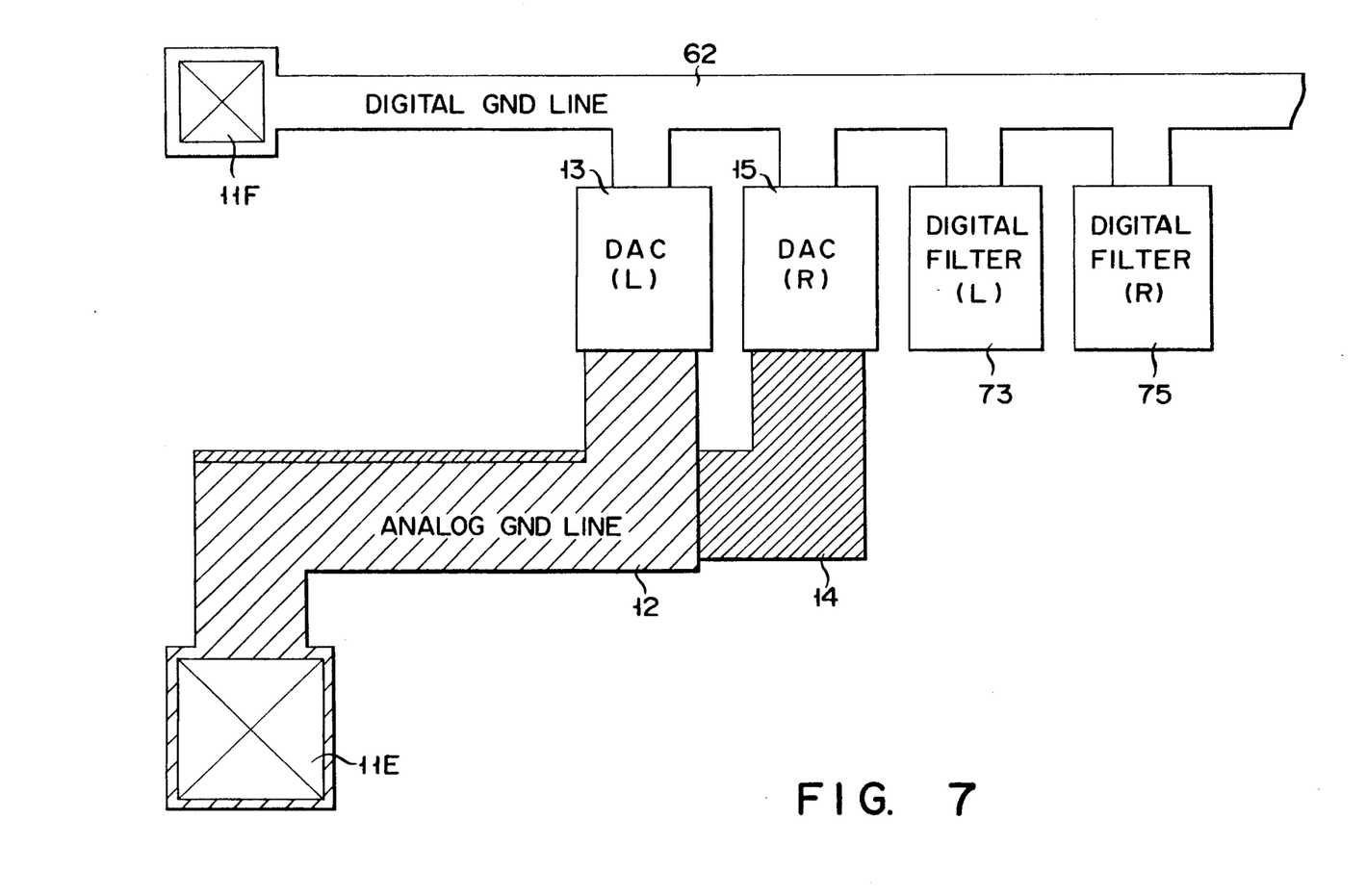
FIG. 7 is a partial plane view showing still another wiring pattern of a semiconductor device having a multi-layered wiring structure according to the present invention.

FIG. 7 shows a modification of FIG. 6. In this case, a multi-layered wiring structure is used for analog GND lines 12 and 14 of DACs 13 and 15, and a single wiring structure is used for digital GND line 62 of DACs 13 and 15 and digital filters 73 and 75. Two type of pads 11E and 11F are respectively used for analog and digital signals, respectively.

Figure 8:
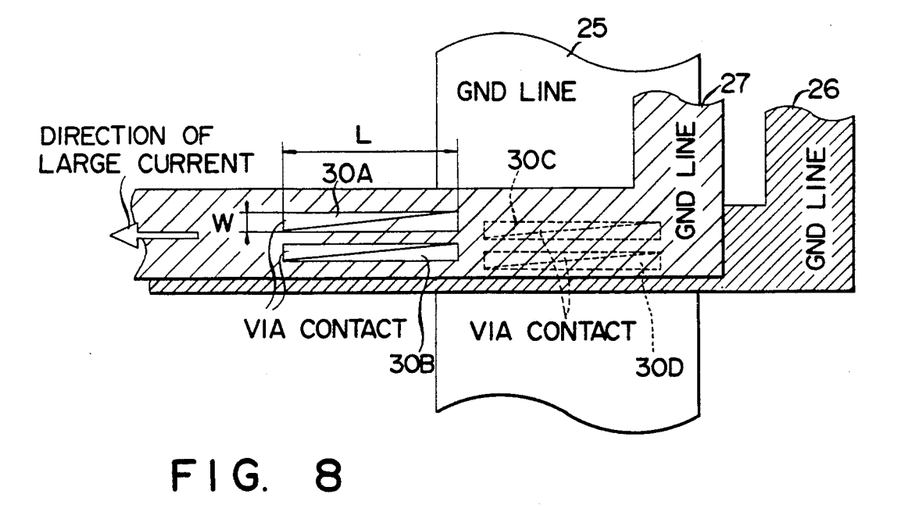
FIG. 8 shows a partial modification of the multi-layered wiring structure in FIG. 2A.

FIG. 8 is a view showing a partial modification of the multi-layered wiring structure in FIG. 2A.

In FIG. 8, upper aluminum line 27 is electrically connected through via contacts 30A and 30B to middle aluminum line 26 extending parallel to line 27 thereunder and middle aluminum line 26 is electrically connected through via contacts 30C and 30D to lower aluminum line 25 extending perpendicularly to line 26 thereunder.

According to the characteristic feature of this embodiment in FIG. 8, longitudinal length L of via contacts 30A and 30B is set to be larger than width W thereof. Length L is set to be large in order to increase an electrical contact area between GND lines 26 and 27 and to reduce contact resistances of via contacts 30A and 30B located between GND lines 26 and 27. Width W is set to be small in order to avoid concentration of a current density caused by partially decreasing the actual cross-sectional area of GND line 27 due to formation of via contacts 30A and 30B.

If width W of via contacts 30A and 30B is large in a direction of width W of line 27, the sectional area of line 27 is smaller at each portion of the via contacts than at other portions, thereby increasing an electrical resistance at the via contact portions. At this time, most of Joule heat generated by a large power source current supplied to line 27 is concentrated on the via contact portion of line 27 having a small sectional area, and the semiconductor device may become defective by locally generated Joule heat. However, this problem rarely occurs in the structure in FIG. 8.

In the embodiment in FIG. 8, since two-story GND lines 26 and 27 extend, a ratio of line area to a total area of the IC substrate is reduced to an amount corresponding to one line.

Figure 9:
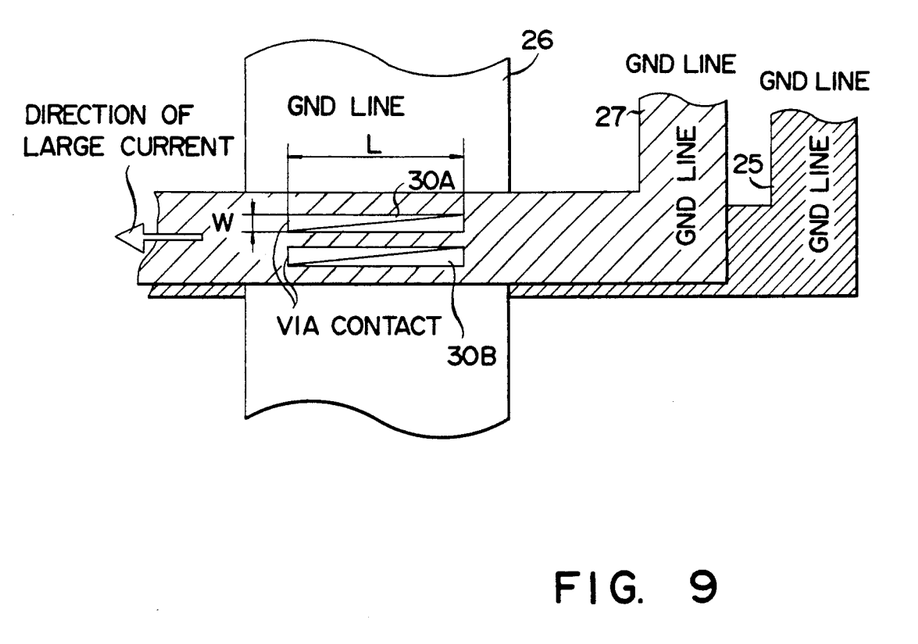
FIG. 9 shows another partial modification of the multi-layered wiring structure in FIG. 2A.

FIG. 9 shows another partial-modification of the multi-layered wiring structure in FIG. 2A.

In FIG. 9, upper-layered aluminum line 27 is electrically connected through via contacts 30A and 30B to middle-layered aluminum line 26 extending perpendicularly to line 27 thereunder. The sectional area of line 27 is decreased by via contacts 30A and 30B, but the sectional area of line 26 is not decreased thereby. (Via contacts 30A and 30B contact the surface of line 26 or are slightly embedded in line 26.)

In the embodiment of FIG. 9, since two-story GND lines 26 and 27 extend, a ratio of line area to a total area of the IC substrate is reduced to an amount corresponding to one line.

Additional advantages and modifications will readily occur to those skilled in the art. Therefore, the invention in its broader aspects is not limited to the specific details, and representative devices, shown and described herein. Accordingly, various modifications may by without departing from the spirit or scope of the general inventive concept as defined by the appended claims and their equivalents.

What is claimed is:

1. A semiconductor device having a multi-layered structure, comprising:
   a pad applied with a predetermined potential;
   a plurality of circuits each having a predetermined function, said plurality of circuits including a first circuit and a second circuit, one of said first and second circuits being at least partially analog;
   a plurality of lines electrically connecting said pad to said circuits;
   an insulating interlayer between said pad and said plurality of circuits for electrically isolating said plurality of lines from each other;
   said plurality of lines including a first line electrically connecting a ground terminal of said first circuit to said pad and a second line, located under said first line, electrically connecting a ground terminal of said second circuit to said pad; and
   said insulating interlayer being sandwiched between said first line and said second line.

2. A semiconductor device according to claim 1, wherein at least one of said plurality of lines is parallelly superposed on another one of said lines on the semiconductor device.

3. A semiconductor device according to claim 1 or 2, wherein at least one of said plurality of lines crosses another one of said lines on the semiconductor device.

4. A semiconductor device according to claim 1, wherein said plurality of circuits further includes a third circuit;
   said plurality of lines further including a third line located under said second line connecting a ground terminal of said third circuit to said pad; and
   said insulating interlayer being sandwiched between said second line and said third line.

5. A semiconductor device according to claim 1, wherein said first circuit is a D/A converter wherein said ground terminal is an analog signal ground terminal, said second circuit is a D/A converter wherein said ground terminal is an analog signal ground terminal, and said plurality of circuits further includes a third D/A converter;
   said plurality of lines further including a third line connecting an analog signal ground terminal of said third D/A converter to said pad; and
   said insulating interlayer being sandwiched between said second line and said third line located under said second line.

6. A semiconductor device according to claim 5, wherein said plurality of lines further include a fourth line, being independent of said first, second and third lines, for connecting a digital signal ground terminal for each of said first, second and third D/A converters to said pad.

7. A semiconductor device according to claim 1, wherein said first circuit is a D/A converter wherein said ground terminal is an analog signal ground terminal, and said second circuit is a D/A converter wherein said ground terminal is an analog signal ground terminal; and
   said plurality of lines further including a third line connecting a digital signal ground terminal for each of said first and second D/A converters to a second pad, said third line being independent of said first and second lines.

8. A semiconductor device having a multi-layered structure, comprising:
   a first pad applied with a predetermined potential;
   a second pad applied with a predetermined potential;
   a plurality of circuits, said plurality of circuits including a first circuit, a second circuit, and a third circuit, one of said first, second and third circuits being at least partially analog;
   a plurality of lines electrically connecting each of said circuits to one of said first and second pads;

an insulating interlayer between said first pad and said plurality of circuits and between said second pad and said plurality of circuits for electrically isolating said plurality of lines from each other;

said plurality of lines including a first line for connecting said first circuit to said first pad, a second line for connecting said second circuit to said second pad, and a third line for connecting said third circuit to said first pad;

said second line being under said first line and said third line being under said second line; and said insulating interlayer being sandwiched between said first line and second line, and said insulating interlayer being sandwiched between said second line and said third line.

9. A semiconductor device according to claim 8, wherein said first line is connected to a ground terminal of said first circuit, and said third line is connected to a ground terminal of said third circuit.

10. A semiconductor device according to claim 9, wherein said second line is connected to a ground terminal of said second circuit.

11. A semiconductor device according to claim 9, wherein said second line is connected to a signal terminal of said second circuit.

12. A semiconductor device having a multi-layered structure, comprising:

a pad applied with a predetermined potential;

a plurality of circuits each having a predetermined function, said plurality of circuits including a first circuit, a second circuit, a third circuit, and a fourth circuit, one of said first, second, third and fourth circuits being at least partially analog;

a plurality of lines for electrically connecting said pad to said circuits;

an insulating interlayer between said pad and said plurality of circuits for electrically isolating said plurality of lines from each other;

said plurality of lines including a first line connecting a ground terminal of said first circuit to said pad, a second line connecting a signal terminal of said second circuit to a signal terminal of said fourth circuit, and a third line connecting a ground terminal of said third circuit to said pad;

said second line being under said first line and said third line being under said second line; and said insulating interlayer being sandwiched between said first line and said second line, and said insulating layer being sandwiched between said second line and said third line;

wherein said second line is electrostatically shielded by said first and second lines, each of said first and second lines having a ground potential.

* * * * *